US012614052B2

(12) United States Patent
Raga-Barone

(10) Patent No.: US 12,614,052 B2
(45) Date of Patent: Apr. 28, 2026

(54) FIXTURE FOR RADIO FREQUENCY IDENTIFICATION TAG

(71) Applicant: GlobalFoundries U.S. Inc., Malta, NY (US)

(72) Inventor: Michael McCormick Raga-Barone, Ballston Spa, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/675,891

(22) Filed: May 28, 2024

(65) Prior Publication Data

US 2025/0371303 A1      Dec. 4, 2025

(51) Int. Cl.
*G06K 19/073* (2006.01)
*H05K 5/02* (2006.01)

(52) U.S. Cl.
CPC ..... *G06K 19/07327* (2013.01); *H05K 5/0208* (2013.01); *H05K 5/0217* (2013.01)

(58) Field of Classification Search
CPC ........... G06K 19/07327; H05K 5/0208; H05K 5/0217
See application file for complete search history.

(56) References Cited

U.S. PATENT DOCUMENTS 6,550,619 B2    4/2003  Bores et al.
7,719,425 B2    5/2010  Colby

| | | | |
|---|---|---|---|
| 10,692,316 B2 * | 6/2020 | Clouser | G06Q 10/0832 |
| 10,896,834 B2 | 1/2021 | Kirkland et al. | |
| 10,956,804 B2 * | 3/2021 | Schnippering ... | G06K 19/07762 |
| 2004/0074974 A1 * | 4/2004 | Senba | G06K 19/07728 |
| | | | 343/866 |
| 2009/0303003 A1 | 12/2009 | Pritchard et al. | |
| 2010/0127835 A1 | 5/2010 | Pomerantz | |
| 2020/0012912 A1 * | 1/2020 | Klimt | G06K 19/0723 |

FOREIGN PATENT DOCUMENTS

| | | | | |
|---|---|---|---|---|
| CN | 108596320 B | * | 3/2021 | ......... G06K 17/0029 |
| JP | 2005191419 | | 7/2005 | |
| WO | 2020026645 | | 2/2020 | |

* cited by examiner

*Primary Examiner* — Sonji N Johnson

(74) *Attorney, Agent, or Firm* — Francois Pagette; Andrew M. Calderon; Calderon Safran & Wright P.C.

(57) ABSTRACT

The present disclosure relates to a fixture and, more particularly, to a fixture which holds a radio frequency identification tag and methods of use. The structure includes a cage comprising a top portion, a bottom portion attached to the top portion and a storage space between the top portion and the bottom portion; a moveable linkage system extending within the storage space; a door attached to a first end of the linkage system, the door being moveable between an open position and a closed position; and a cam mechanism comprising structures with surfaces that permit the door to move from the closed position to the open position and to prevent the door from closing when in the closed position.

7 Claims, 6 Drawing Sheets

FIXTURE FOR RADIO FREQUENCY IDENTIFICATION TAG

BACKGROUND

The present disclosure relates to a fixture and, more particularly, to a fixture which holds a radio frequency identification tag and methods of use.

Automated Material Handling Systems (AMHS) ensure efficient transport of material, e.g., semiconductor wafers, from one place to another in a manufacturing facility of a semiconductor fab. For example, the AMHS can transport semiconductor wafers throughout different manufacturing areas for different manufacturing processes. The AMHS typically is monitored during the manufacturing process steps to efficiently coordinate and transport the semiconductor wafers to their processing stations.

SUMMARY

In an aspect of the disclosure, a structure comprises: a cage comprising a top portion, a bottom portion attached to the top portion and a storage space between the top portion and the bottom portion; a moveable linkage system extending within the storage space; a door attached to a first end of the linkage system, the door being moveable between an open position and a closed position; and a cam mechanism comprising structures with surfaces that permit the door to move from the closed position to the open position and to prevent the door from closing when in the closed position.

In an aspect of the disclosure, a structure comprises: a cage comprising a cavity and conductive material to shield an interior of the cavity from electromagnetic waves; a linkage system moveable between a first position within the cavity and a second position extending outside of the cavity; a door attached to the linkage system; and a mechanism attached to the linkage system which is structured to hold the door in an open position exposing the cavity and to allow closure of the door into a closed position thereby enclosing the cavity.

In an aspect of the disclosure, a structure comprises: a cage comprising conductive material to shield an interior portion from electromagnetic waves; a linkage system moveable between a first position and a second position, the second position extending outside of the cage; a handle attached to a first end the linkage system and which extends through a slot within the cage; a door attached to a second end of the linkage system extendable between an open position and a closed position; a button; a spring loaded mechanism coupled to the linkage system and the cage; and a cam mechanism comprising a first structure and a second structure, the first structure coupled to the linkage system and linearly moveable and the second structure coupled to the button and vertically moveable.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a fixture and, more particularly, to a fixture which holds and transports a radio frequency identification tag and methods of use. In embodiments, the fixture may be a faraday cage which stores and transports a radio frequency identification (RFID) tag throughout a manufacturing facility. For example, the RFID tag may be used to track materials throughout the manufacturing process of semiconductor chips within a semiconductor fab, particularly used in combination with an Automated Material Handling System (AMHS). The RFID tag may, for example, be used to track the location of different materials including, e.g., wafers, chemicals, etc., used in the semiconductor fabrication processes; although other applications are also contemplated herein.

Advantageously, the faraday cage described herein allows an AMHS to transport RFID labeled materials/carriers/hardware that would otherwise not be compatible with AMHS transportation. In addition, the faraday cage may be used to track the location of an empty container carrier using its unique RFID tag. The faraday cage also enables flexible semiconductor tool positioning, in addition to enabling future AMHS transport process development that automates consumable movement in a semiconductor fab including consumables for preventive maintenance, hand tools, personal protective equipment (PPE), lithography chemicals, gas cylinders etc. In addition, the fixture shields an RFID tag from being read by semiconductor equipment. The fixture can be connected to a semiconductor carrier in an AMHS. In more specific embodiments, the fixture may be adapted to mount to a Front Opening Shipping Box (FOSB) or Front Opening Unified Pod (FOUP), e.g., carrier box used in a semiconductor manufacturing process line.

Figure 1:
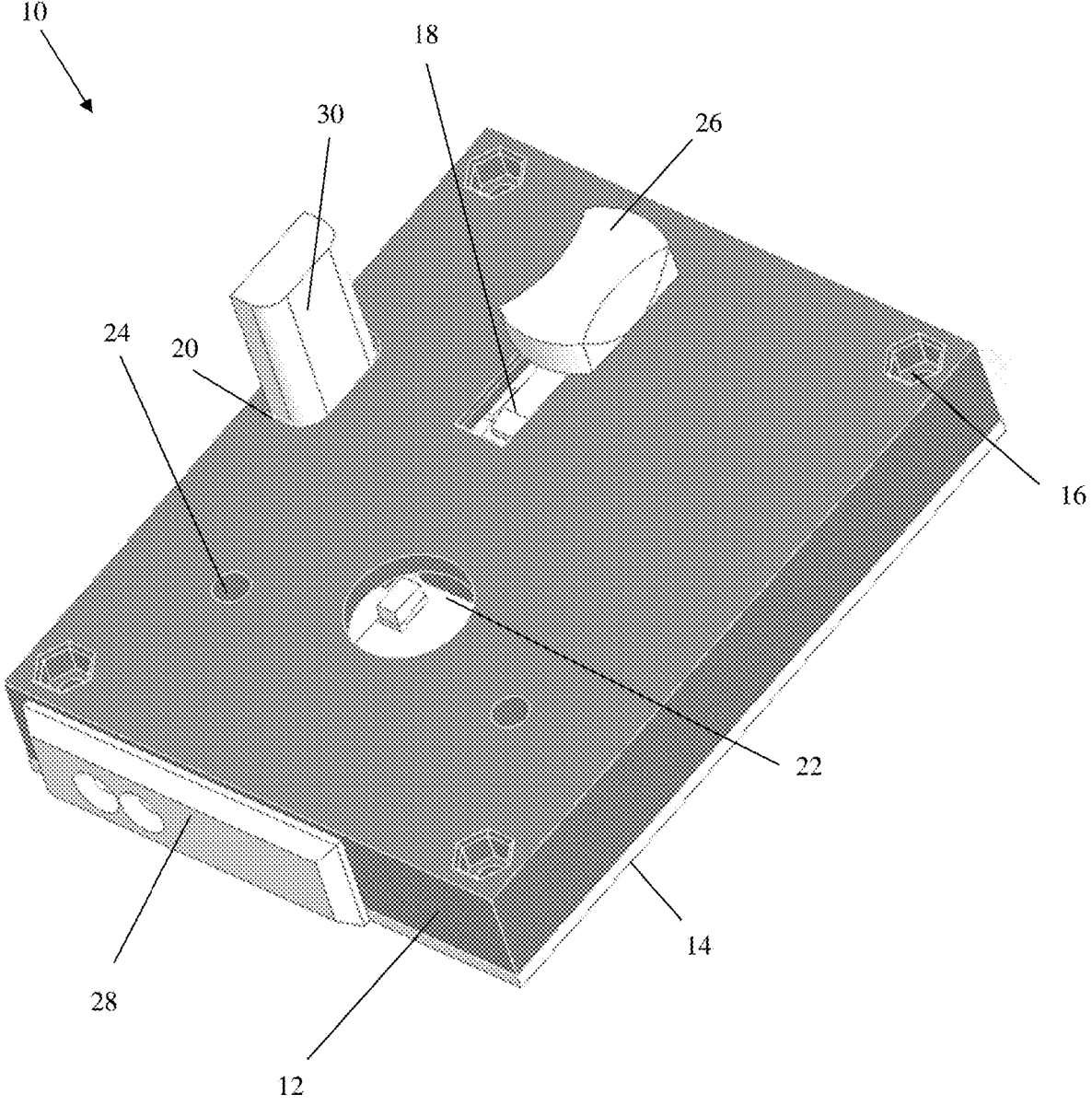
FIG. 1 shows a first view of a fixture in accordance with aspects of the present disclosure.

FIG. 1 shows a fixture in accordance with aspects of the present disclosure. In embodiments, the fixture 10 is a faraday cage comprising a top portion 12 and a bottom portion 14. The top portion 12 may be a cover comprising a top wall and side wall, and the bottom portion 14 may be a plate, for example. The top portion 12 and the bottom portion 14 may be coupled together by any conventional mechanism including, for example, screws or adhesive, to form the faraday cage.

The top portion 12 and the bottom portion 14 may be composed of any appropriate material such as, e.g., plastic, metal or any combination thereof, with a layer of conductive coating or material such as aluminum foil, copper or other material to shield the enclosure from electromagnetic waves. In embodiments, for example, the top portion 12 and the bottom portion 14 may be made from the electromagnetic shielding material, itself, without the need for any additional layers of material. For example, the conductive coating or material may be any type of electromagnetic shielding material used as a base, layer, or coating which prevents the reading of the RFID tag stored within the fixture 10, e.g., blocks electromagnetic waves from interacting with the RFID tag inside the fixture.

Still referring to FIG. 1, the top portion 12 includes holes 16 to accommodate screws or other attachment mechanisms (e.g., rivets, etc.) for attaching the top portion 12 to the bottom portion 14. The top portion 12 also includes a slot 18 and additional holes 20, 22, 24. In embodiments, the slot 18 may be an elongated hole to accommodate a handle or knob 26 coupled to a linkage system 38 and cam mechanism 40 as described in more detail with respect to FIGS. 3-6. In embodiments, the handle or knob 26 is slidable within the slot 18 between a first, closed position as shown in FIG. 1 and a second, open position as shown in FIG. 2.

Figure 2:
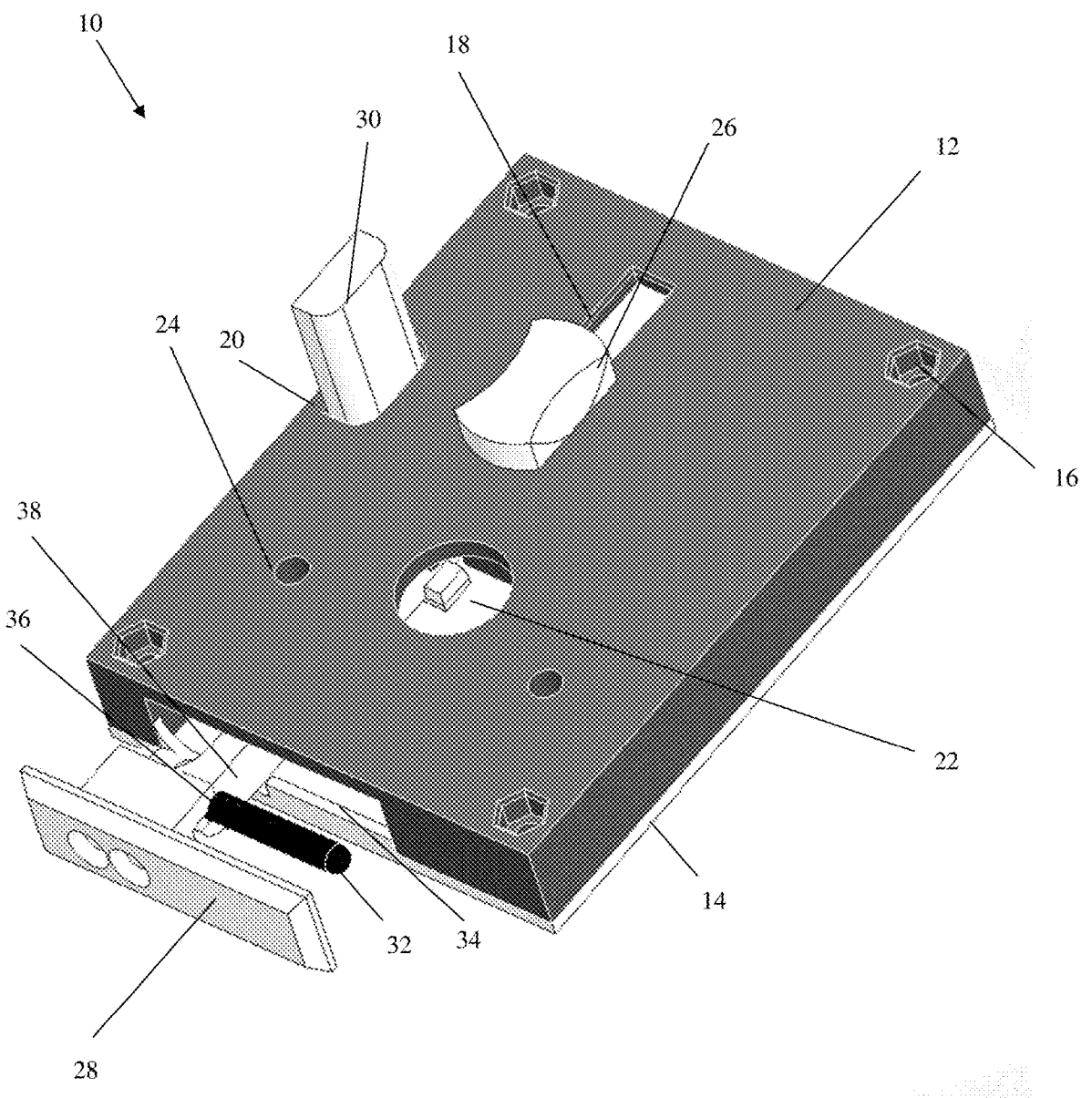
FIG. 2 shows a second view of a fixture in accordance with aspects of the present disclosure.
Figure 3:
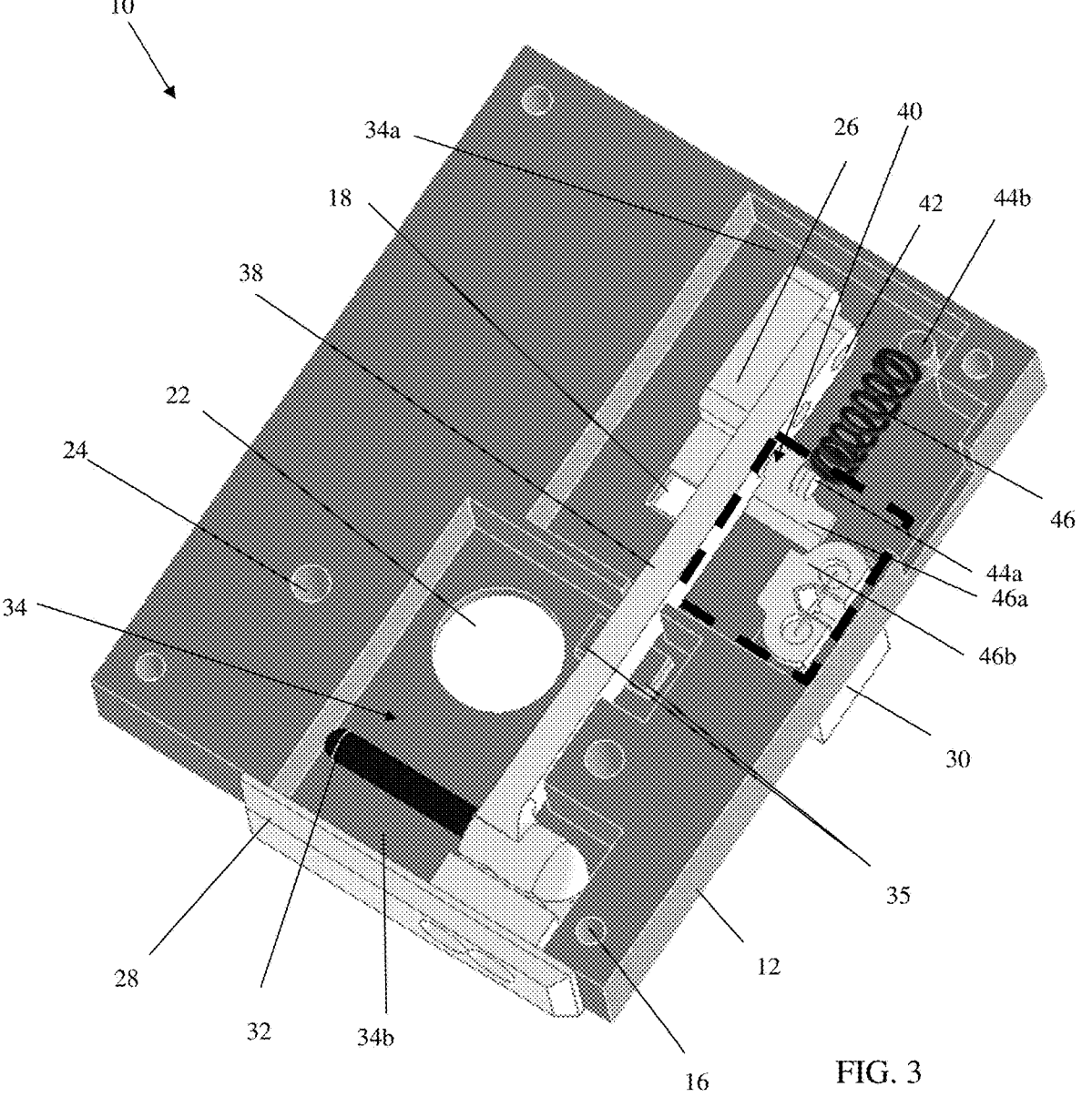
FIG. 3 shows a partial of the fixture with a door in a closed position in accordance with aspects of the present disclosure.

A door 28 may be attached to the handle or knob 26 through a linkage system 38 (shown in FIGS. 2 and 3). In embodiments, sliding of the handle or knob 26 will move the linkage system 38 which, in turn, will open or close the door 28. In embodiments, the handle or knob 26 may interact with a carrier system. In such a configuration, in use, the door 28 will automatically close when placed on the carrier system and, similarly, will automatically open when removed from the carrier system. In the closed position, the door 28 rests against a side surface of the top portion 12. And, upon removing the fixture from the carrier system, the door 28 will extend away from the side surface of the top portion 12 to expose the RFID tag as shown in FIG. 2. Accordingly, in the open position shown in FIG. 2, for example, the RFID tag will no longer be shielded within the fixture 10. The door 28 can also be opened manually.

The hole 20 may accommodate a spring loaded button 30. In embodiments, the button 30 remains in the fully extended position until it is pressed downwards. Moreover, after the button 30 is released, the button 30 will automatically return to is fully extended position. In the fully extended position, the door 28 will be in the closed or open position as described in more detail with respect to at least FIGS. 2-6.

Still referring to FIG. 1, the hole 22 may be a mounting hole of any desirable shape, e.g., round, square, rectangular, etc., any of which shape is designed to accommodate a mounting mechanism of a FOUP or FOSB or other carrier system. In embodiments, the mounting mechanism of the FOUP or FOSB or other carrier system would be insertable into the hole 22, effectively providing an additional shield to prevent reading of the RFID tag when the door 28 is in the closed position, e.g., with the RFID shielded within the fixture 10 as shown in FIG. 1. The holes 24 may be alignment holes or, alternatively, anti-rotation holes which mate with pegs of other protuberances extending from the FOUP or FOSB or other a carrier system.

FIG. 2 shows the fixture 10 with the door 28 in the open position. As shown in FIG. 2, the RFID tag 32 can be mounted to the linkage system (e.g., arm) 38, which is attached to the handle or knob 26. In the open position shown in FIG. 2, the handle or knob 26 is in the second position with the door 28 open; compared to the handle or knob 26 in the first position with the door 28 in the closed position and the RFID tag 32 stored within the cavity (storage space) 34 as shown in FIG. 1. In this open position, an RFID tag 32 is moved from within the cavity 34 of the fixture 10 to outside of the fixture 10. In this open position, the RFID tag 32 will no longer be shielded within the fixture 10 and, hence, can be read by an RFID reader.

FIG. 3 shows a partial view of the fixture 10 in accordance with aspects of the present disclosure. In this partial view, the bottom portion 14 of the fixture 10 has been removed to show a cam mechanism 40 and linkage system 38, amongst other structures. In embodiments, the linkage system 38 may be an arm attached to both the door 28 and an underside of the handle or knob 26. In this way, the door 28 can be opened and closed by sliding the handle or knob 26 between the open position shown in FIG. 1 and the closed position shown in FIG. 2.

Still referring to FIG. 3, the linkage system 38 may include an aperture 36 to accommodate and hold the RFID tag 32. In embodiments, the linkage system 38 may include other holding mechanisms to hold the RFID tag 32, e.g., clamp, etc. The linkage system 38 also includes one or more apertures 42 on an opposing side of the door 28. The one or more apertures 42 may be used to accommodate a peg or protuberance 44a extending from the underside of the handle or knob 26. In this way, the cam mechanism 40 may be adjustable by mounting the peg or protuberance 44a to one of the different apertures 42 in the linkage system 38.

FIG. 3 further shows the cavity 34 structured and configured to accommodate the linkage system 38 and the cam mechanism 40. For example, the cavity 34 may include two separate chambers 34a, 34b, with the linkage system 38 extending between the two separate chambers 34a, 34b. The cam mechanism 40 may be accommodated in the chamber 34a. The chamber 34b may also include guiding protuberances 35 on both sides of the linkage system 38. The guiding protuberances 35 ensure that the linkage system 38 remains in its proper glide path during the opening and closing of the door 28. In such a configuration and structural arrangement, the guiding protuberances 35 ensure that the linkage system 38 remains in a single plane and, hence, enables a smooth movement of the RFID tag into and out of the fixture 10. Accordingly, the cavity 34 may comprise an open internal structure to allow for the storage and movement of one or more RFID tags, in addition to the linkage system 38 and the cam mechanism 40.

FIG. 3 also shows a peg or protuberance 44a extending from an underside of the handle or knob 26 or the linkage system 42 and a peg or protuberance 44b extending from an underside of the top portion 12. In embodiments, a spring 46 may extend between the pegs 44a, 44b. In use, the spring 46 may be used to automatically close the door 28 and maintain it in the closed position by exerting a spring force between the pegs 44a, 44b. For example, upon pressing the button 30 with the door 28 in the open position, the spring 46 will automatically close the door 28 by exerting a spring force between the pegs 44a, 44b. In this closed position, the handle or knob 26 will be in the first, closed position shown in FIGS. 1 and 4.

In alternative embodiments, reference numeral 46 can equally represent an air cylinder, hydraulic cylinder, rack and pinion gear, servo motor or other mechanical or electronic mechanism that is configured and structured to open and close the door 28. For example, automated movement of the door 28 may be caused by electronic, pneumatic or hydraulic mechanisms; whereas manual operation may be used with the spring. In embodiments, the mechanical or electronic mechanism may eliminate the need for the cam mechanism 40.

As further shown in FIG. 3, the cam mechanism 40 includes opposing stop or interference structures 46a, 46b. In embodiments, the stop or interference structure 46a may be a first extending structure integrally part of the linkage system 38, extending perpendicular thereto. On the other hand, the stop or interference structure 46b may be a second extending structure which extends from an underside of the button 30, partially overlapping with and in the same plane or level as the stop or interference structure 46a when the button 30 is in its fully extended, upward position. In the closed position of the door 28, the opposing stop or interference structures 46a, 46b may be remote from one another; whereas in the open position of the door 28, the opposing stop or interference structures 46a, 46b engage with one another, e.g., contact with one another. In the engaged position, the opposing stop or interference structures 46a, 46b will prevent the door 28 from closing, despite the spring force exerted by the spring 46.

Figure 4:
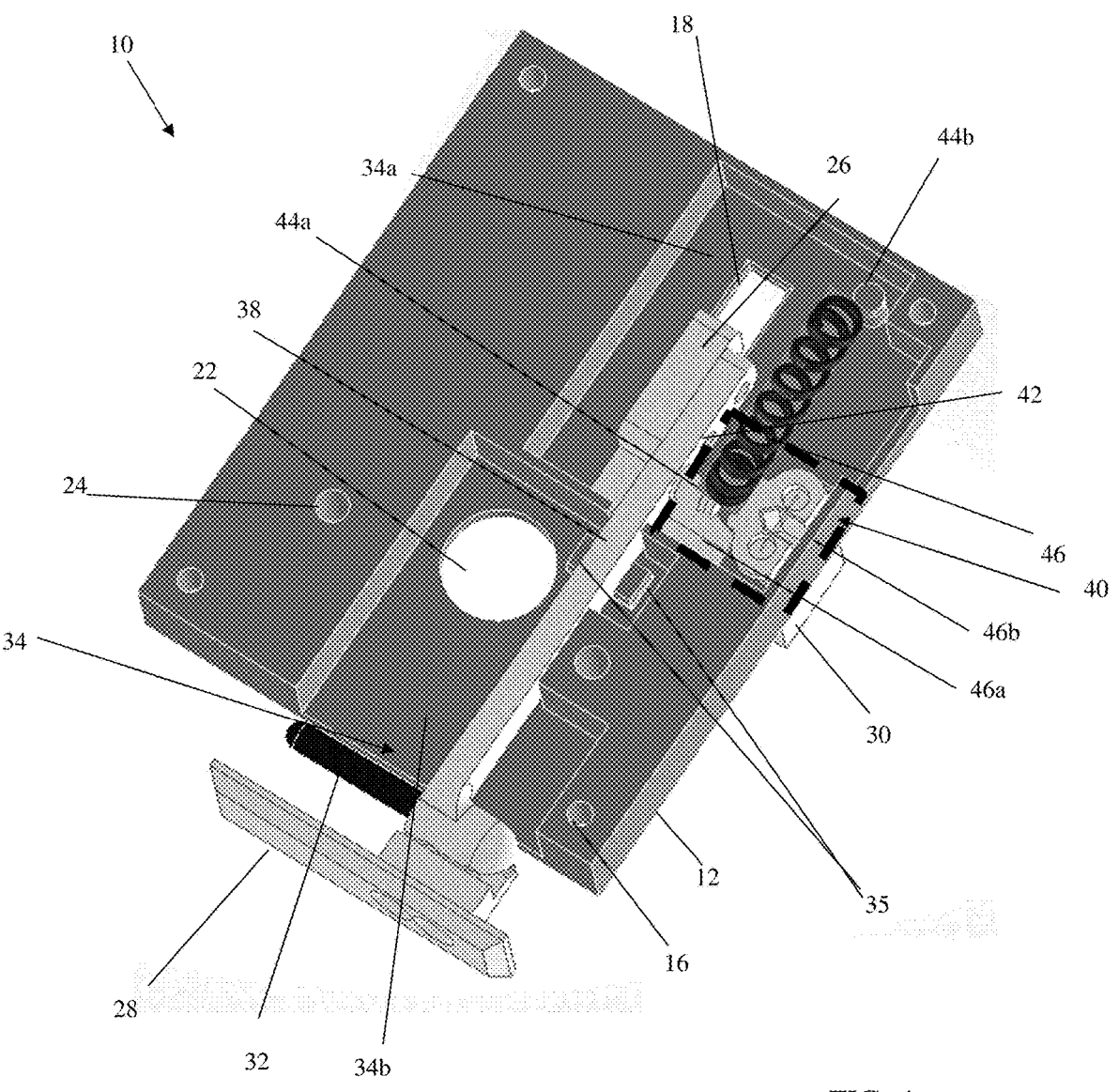
FIGS. 4 and 5 show partial views of the fixture with the door in an open position in accordance with aspects of the present disclosure.
Figure 5:
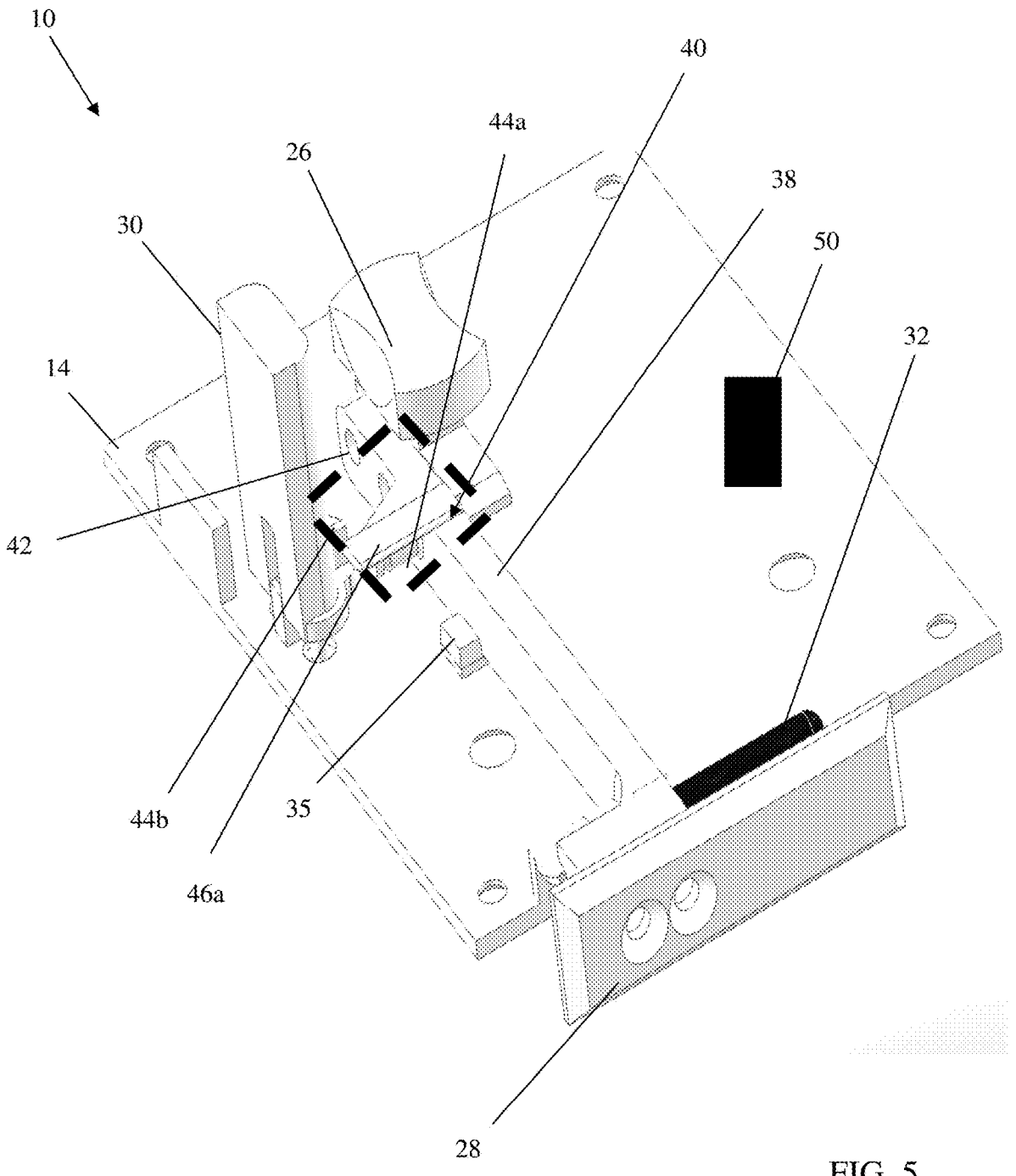

FIGS. 4 and 5 show a partial view of the fixture 10 with the door 28 in the open position. As shown in these partial views, the opposing stop or interference structures 46a, 46b contact or engage with one another, which holds the door 28 in an open position. Accordingly, in use, the movement of the handle or knob 26 will move the stop or interference structure 46a between the first side of the stop or interference structure 46b to a second side of the stop or interference structure 46b. In the second position, surfaces of the opposing stop or interference structures 46a, 46b rest against each other, holding the door 28 in the open position. By depressing the button 30, the stop or interference structure 46b will be moved to a different plane or level than the stop or interference structure 46a, e.g., below the stop or interference structure 46a, thus allowing the spring force of the spring 46 to bring the door 28 into the closed position.

As further shown in FIG. 5, the fixture 10 may include a computer, battery, and/or control system and accompanying software as represented by reference numeral 50. The computer, battery, and/or control system and accompanying software 50 will enable automatic interfacing with an associated semiconductor carrier such as a FOUP and/or processing equipment in a semiconductor fab. This interfacing can be done by reading the RFID tag 32.

Figures 6, 7:
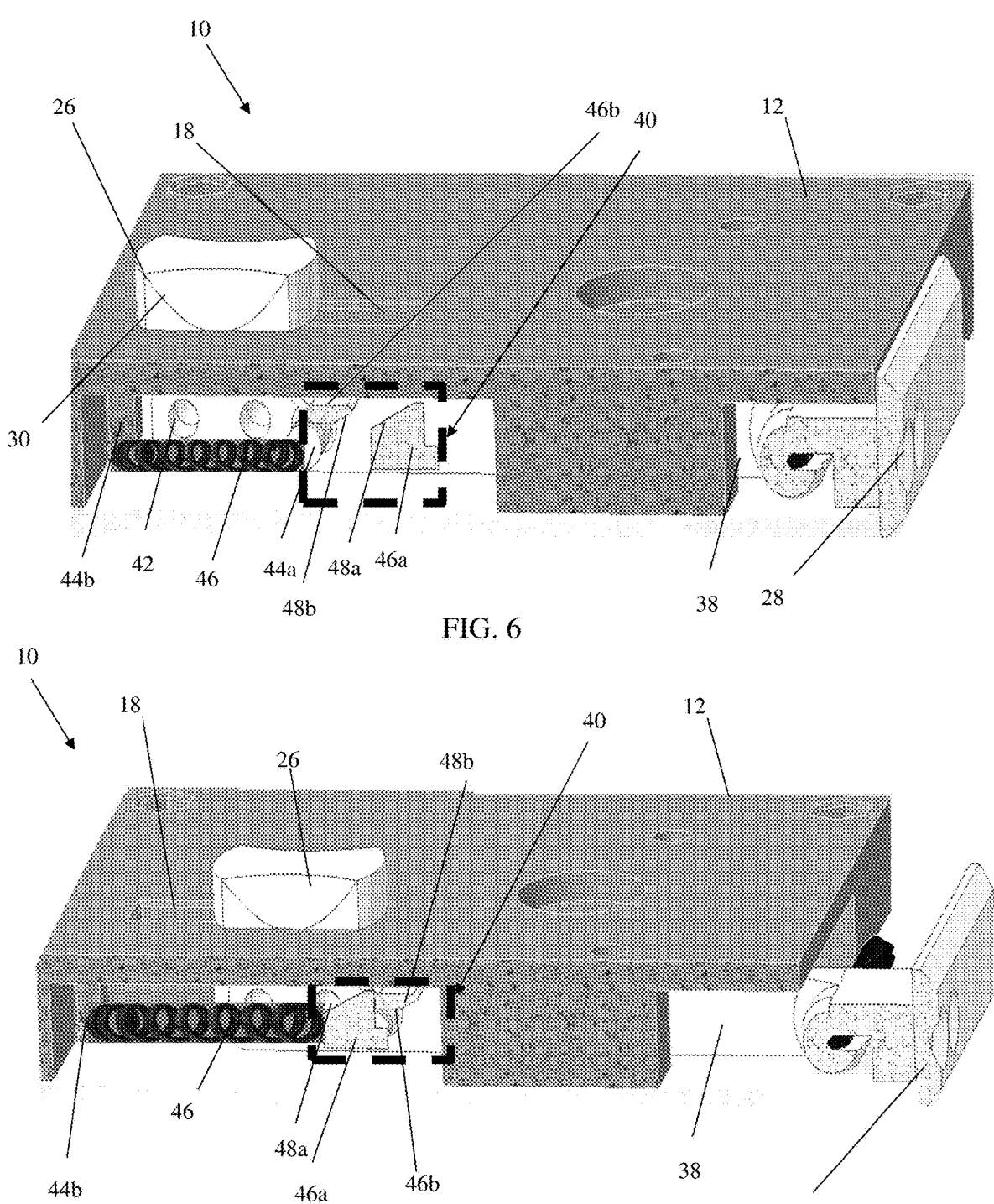
FIG. 6 shows a partial cutaway side view of the fixture with the door in the closed position in accordance with aspects of the present disclosure.
FIG. 7 shows a partial cutaway side view of the fixture with the door in the open position in accordance with aspects of the present disclosure.

FIGS. 6 and 7 show partial cutaway side views of the fixture 10. In FIG. 6, the door 28 is in the closed position with the opposing stop or interference structures 46a, 46b remotely positioned from one another and the knob or handle 26 in the first position. In FIG. 7, the door 28 is in the open position with the opposing stop or interference structure 46a contacting or resting on the opposing stop or interference structure 46a and the knob or handle 26 in the second position. In this way, the door 28 remains open by the opposing stop or interference structures 46a, 46b overcoming any spring force of the spring 46.

As also shown in these views, the opposing stop or interference structures 46a, 46b include opposing sloped surfaces 48a, 48b, respectively. In embodiments, the sloped surfaces 48a, 48b should have a same or similarly angled slope, e.g., be complementary, respective to the horizontal or vertical perspective. In embodiments, the sloped surfaces 48a, 48b are designed to engage with one another during the travel of the linkage system 38 as the door is moved between the open position and closed position. For example, as the interference structure 46a moves linearly, the sloped surface 48a will slide underneath the sloped surface 48b. In this way, the stop or interference structure 46a will slide underneath the stop or interference structure 46b and the stop or interference structure 46b will move vertically so that the door 28 can be moved from the closed position to the open position. To close the door 28, the stop or interference structure 46b is again moved vertically by pressing the button 30 so that the door 28 can be closed by exertion of the spring force of the spring 46.

It should be recognized by one of skill in the art, that the button 30 will automatically be lowered or depressed as the stop or interference structure 46a slides underneath the stop or interference structure 46b. And, when the door 28 is in the open position, the button 30 will automatically return to the original extended position due to the spring load exerted onto the button. The button 30 automatically returning to the original extended position will also move the stop or interference structure 46b into the same plane (e.g., level) as the stop or interference structure 46a, thus preventing backward movement of the linkage system 38 from moving and, hence, ensuring that the door 28 remains in the open position.

The fixture as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a cage comprising a cavity with conductive material to shield the cavity from electromagnetic waves;
   a linkage system comprising different apertures and which is moveable between a first position within the cavity and a second position extending outside of the cavity;
   a door attached to the linkage system and which slides between an open position and a closed position; and
   an cam mechanism attached to the linkage system which is structured to hold the door in the open position exposing the cavity and to allow closure of the door into the closed position thereby enclosing the cavity, the cam mechanism being adjustable by placing a protuberance within the different apertures of the linkage system.

2. The structure of claim 1, wherein the cam mechanism is movable by one of a hydraulic system, pneumatic system and an electromechanical system.

3. The structure of claim 1, wherein the cam mechanism comprises a first structure linearly moveable with the linkage system and a second structure vertically moveable with a spring loaded mechanism.

4. The structure of claim 3, wherein the first structure slides along the second structure during movement of the door from the closed position to the open position.

5. The structure of claim 4, wherein the first structure rests against the second structure to prevent the door from moving from the opened position to the closed.

6. The structure of claim 1, further comprising a spring coupled between the linkage system and the cage, the spring exerting a force to close the door when the spring loaded mechanism is depressed and the second structure is moved vertically away from the first structure.

7. A structure comprising:

a cage comprising conductive material to shield an interior portion from electromagnetic waves;

a linkage system moveable between a first position and a second position, the second position extending outside of the cage;

a handle attached to a first end the linkage system by extending through a slot within the cage, the handle further configured to slide within the slot and linearly move the linkage system between the first position and the second position;

a door attached to a second end of the linkage system and which is linearly slidable between an open position and a closed position;

a button moveable vertically, orthogonal to the linkage system;

a spring loaded mechanism coupled to the linkage system and the cage; and a cam mechanism comprising a first structure and a second structure, the first structure coupled to the linkage system and linearly moveable and the second structure coupled to the button and vertically moveable.

\* \* \* \* \*